(12) United States Patent
Asakawa et al.

(10) Patent No.: US 11,106,323 B1
(45) Date of Patent: Aug. 31, 2021

(54) INPUT DEVICE

(71) Applicant: MINEBEA MITSUMI Inc., Nagano (JP)

(72) Inventors: Toshiaki Asakawa, Shizuoka (JP); Shigeyuki Adachi, Shizuoka (JP); Atsushi Kitamura, Shizuoka (JP)

(73) Assignee: MINEBEA MITSUMI Inc., Nagano (JP)

( * ) Notice: Subject to any disclaimer, the term of this patent is extended or adjusted under 35 U.S.C. 154(b) by 0 days.

(21) Appl. No.: 17/258,241

(22) PCT Filed: Jul. 2, 2019

(86) PCT No.: PCT/JP2019/026336
§ 371 (c)(1),
(2) Date: Jan. 6, 2021

(87) PCT Pub. No.: WO2020/017322
PCT Pub. Date: Jan. 23, 2020

(30) Foreign Application Priority Data

Jul. 20, 2018  (JP) .............................. JP2018-137172

(51) Int. Cl.
*G06F 3/045* (2006.01)
*H01C 1/14* (2006.01)
(Continued)

(52) U.S. Cl.
CPC ............... *G06F 3/045* (2013.01); *H01C 1/14* (2013.01); *H01C 1/16* (2013.01); *H01L 31/0445* (2014.12)

(58) Field of Classification Search
CPC .............. H01C 1/14; H01C 1/16; G06F 3/045
See application file for complete search history.

(56) References Cited

U.S. PATENT DOCUMENTS 8,742,530 B2    6/2014  Kajiya et al.
2002/0075245 A1*  6/2002  Kawashima ...... G02F 1/133615
                                                            345/173
(Continued)

FOREIGN PATENT DOCUMENTS

JP    S62-106534    5/1987
JP    2012-163789   8/2012
(Continued)

OTHER PUBLICATIONS

International Search Report for PCT/JP2019/026336 dated Oct. 8, 2019.

*Primary Examiner* — Kyung S Lee
(74) *Attorney, Agent, or Firm* — IPUSA, PLLC (57) ABSTRACT

The input device includes an insulating layer, a plurality of first resistors arrayed on one side of the insulating layer with a longitudinal direction thereof extending in a first direction, a plurality of second resistors arrayed on an opposite side of the insulating layer with a longitudinal direction thereof extending in a second direction intersecting the first direction, and a pair of electrodes provided at opposite ends of a corresponding one of the first resistors and the second resistors, wherein upon the first resistors and/or the second resistors being pressed, a resistance value between the pair of electrodes associated with pressed one or more of the first resistors and the second resistors changes continuously in accordance with a magnitude of applied pressure.

10 Claims, 5 Drawing Sheets

(51) Int. Cl.
*H01C 1/16* (2006.01)
*H01L 31/0445* (2014.01)

(56) References Cited

U.S. PATENT DOCUMENTS

| | | | | |
|---|---|---|---|---|
| 2003/0197688 | A1* | 10/2003 | Aufderheide | G06F 3/045 |
| | | | | 345/173 |
| 2005/0237307 | A1* | 10/2005 | Hieda | G06F 3/041 |
| | | | | 345/173 |
| 2006/0250534 | A1* | 11/2006 | Kutscher | H03K 17/964 |
| | | | | 349/41 |
| 2011/0026202 | A1* | 2/2011 | Kai | H01C 10/106 |
| | | | | 361/679.01 |
| 2012/0256838 | A1* | 10/2012 | Lee | H03K 17/9643 |
| | | | | 345/168 |
| 2016/0081184 | A1* | 3/2016 | Katagiri | H01L 51/0021 |
| | | | | 174/268 |
| 2017/0115780 | A1* | 4/2017 | Ogikubo | B32B 27/34 |

FOREIGN PATENT DOCUMENTS

| | | |
|---|---|---|
| JP | 2015-041159 | 3/2015 |
| JP | 2015-079755 | 4/2015 |

\* cited by examiner

INPUT DEVICE

TECHNICAL FIELD

The present invention relates to an input device.

BACKGROUND ART

A touch panel as known in the art is mounted on a display device such as a liquid crystal display device to supply input into electronic equipment or the like. Touch panels are used in various applications because of their capability to supply input based on visually recognizable information provided on the display device.

A resistive-type touch panel and a capacitive-type touch panel are widely known in the art. Moreover, a magnetic-type touch panel having a switch-matrix configuration has also been conceived (see Patent Document 1, for example).

RELATED-ART DOCUMENTS

Patent Document

[Patent Document 1] Japanese Laid-open Patent Publication No. S62-106534

SUMMARY OF THE INVENTION

Problem to be Solved by the Invention

Touch panels of the above-noted types provide two-dimensional information relating to the XY directions, but cannot provide three-dimensional information inclusive of Z-direction information.

In consideration of the above-noted issues, it is an object of the present invention to provide an input device capable of providing three-dimensional information.

Means to Solve the Problem

The input device includes an insulating layer, a plurality of first resistors arrayed on one side of the insulating layer with a longitudinal direction thereof extending in a first direction, a plurality of second resistors arrayed on an opposite side of the insulating layer with a longitudinal direction thereof extending in a second direction intersecting the first direction, and a pair of electrodes provided at opposite ends of a corresponding one of the first resistors and the second resistors, wherein upon the first resistors and/or the second resistors being pressed, a resistance value between the pair of electrodes associated with pressed one or more of the first resistors and the second resistors changes continuously in accordance with a magnitude of applied pressure.

Advantage of the Invention

According to the disclosed technology, an input device capable of providing three-dimensional information is provided.

MODE FOR CARRYING OUT THE INVENTION

In the following, embodiments will be described by referring to the accompanying drawings. In these drawings, the same elements are referred to by the same references, and a description thereof may be omitted.

First Embodiment

Figure 1:
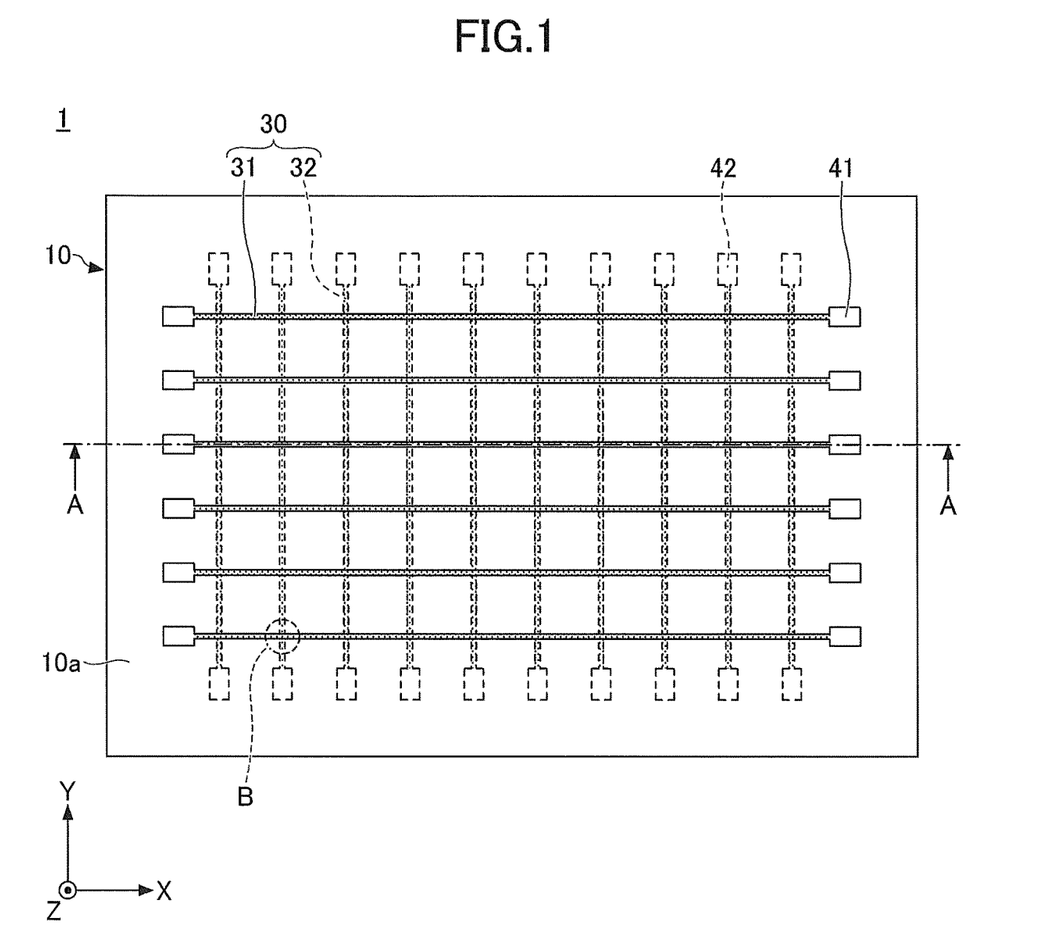
FIG. 1 is a plan view illustrating an example of an input device according to a first embodiment.
Figure 2:
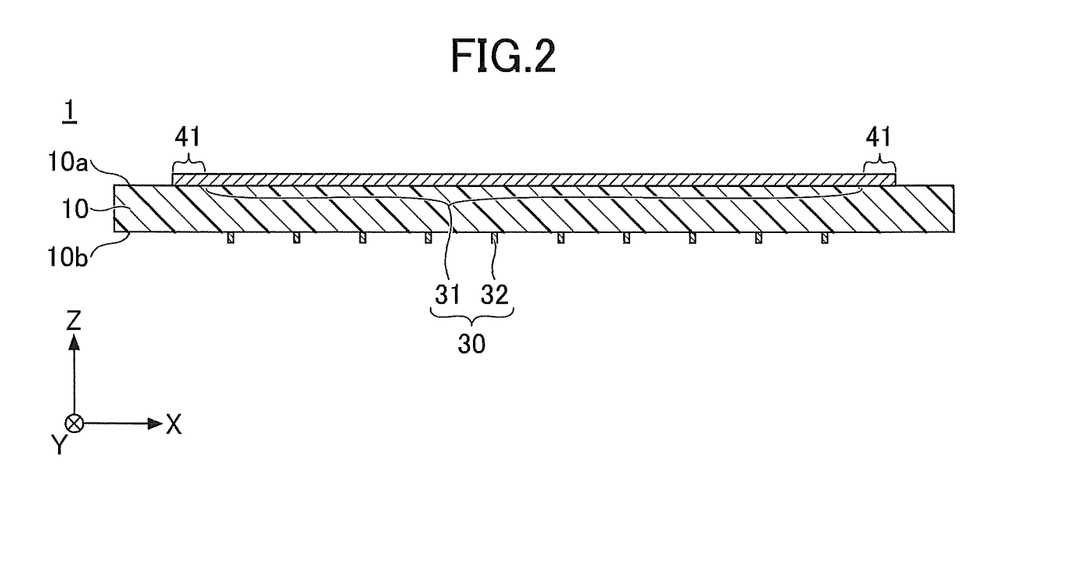
FIG. 2 is a cross-sectional view (part 1) illustrating an example of the input device according to the first embodiment.

FIG. 1 is a plan view illustrating an example of an input device according to a first embodiment. FIG. 2 is a cross-sectional view illustrating an example of the input device according to the first embodiment, and shows a cross-section taken along the line A-A in FIG. 1. With reference to FIG. 1 and FIG. 2, an input device 1 includes a substrate 10, resistors 30 (i.e., a plurality of resistors 31 and 32), and a plurality of terminals 41 and 42.

In the present embodiment, for the sake of convenience, the side of the substrate 10 on which the resistors 31 are situated is referred to as an upper side or a first side, and the side on which the resistors 32 are situated is referred to as a lower side or a second side. A surface of a given member that faces in the same direction as does the side on which the resistors 31 are situated is referred to as a first surface or an upper surface, and a surface of the given member that faces in the same direction as does the side on which the resistors 32 are situated is referred to as a second surface or a lower surface. It may be noted, however, that the input device 1 may be used in an upside-down position, or may be placed at any angle. Further, a plan view refers to a view of an object taken in the direction perpendicular to an upper surface 10a of the substrate 10, and a plane shape refers to the shape of an object as viewed in the direction perpendicular to the upper surface 10a of the substrate 10.

The substrate 10, which is an insulating member that serves as a base layer for the resistors 30 and the like formed thereon, is flexible. The thickness of the substrate 10 may properly be chosen according to application without a particular restriction, and may be about 5 μm to 500 μm, for example. In particular, it is preferable of the thickness of the substrate 10 to be 5 μm to 200 μm from the viewpoint of reducing error in the strain sensitivity of the resistors 31 and 32.

The substrate 10 may be formed of an insulating resin film such as a PI (polyimide) resin, an epoxy resin, a PEEK (polyether ether ketone) resin, a PEN (polyethylene naphthalate) resin, a PET (polyethylene terephthalate) resin, a PPS (polyphenylene sulfide) resin, a polyolefin resin, for example. The term "film" refers to a member that has a thickness of about 500 µm or less, and that is flexible.

Herein, the phrase "formed of an insulating resin film" does not exclude the inclusion of fillers, impurities, or the like in the insulating resin film of the substrate 10. The substrate 10 may be formed of an insulating resin film containing fillers such as silica or alumina, for example.

When there is no need for the substrate 10 to be flexible, a material such as $SiO_2$, $ZrO_2$ (including YSZ), Si, $Si_2N_3$, $Al_2O_3$ (including sapphire), ZnO, a perovskite-based ceramic ($CaTiO_3$, $BaTiO_3$) or the like may be used as the substrate 10.

The resistors 30, which are formed on the substrate 10, serve as a sensing unit having the resistance values thereof varying continuously in response to applied pressure. The resistors 30 may be formed directly on the upper surface 10a and the lower surface 10b of the substrate 10, or formed on the upper surface 10a and the lower surface 10b of the substrate 10 with an intervening layer situated therebetween.

The resistors 30 include a plurality of resistors 31 and 32 stacked one over another through the substrate 10. The term "resistors 30" is a generic term for the plurality of resistors 31 and 32. When there is no need to discriminate the resistors 31 and 32, the term "resistors 30" is used to refer thereto. In FIG. 1B, the resistors 31 and 32 are illustrated in dot shading for the sake of clarity.

The plurality of resistors 31 are thin films that are arrayed in the Y direction at predetermined intervals with the longitudinal direction thereof aligned in the X direction on the upper surface 10a of the substrate 10. The plurality of resistors 32 are thin films that are arrayed in the X direction at predetermined intervals with the longitudinal direction thereof aligned in the Y direction on the lower surface 10b of the substrate 10. It may be noted that it suffices for the plurality of resistors 31 and the plurality of resistors 32 to intersect each other, without having to be orthogonal to each other in a plan view.

The resistors 30 may be made of a material containing Cr (chromium), a material containing Ni (nickel), or a material containing both Cr and Ni, for example. Namely, the resistors 30 may be made of a material containing at least one of Cr and Ni. Examples of the material containing Cr include a Cr mixed-phase film. Examples of the material containing Ni include Cu—Ni (copper nickel). Examples of the material containing both Cr and Ni include Ni—Cr (nickel chromium).

The Cr mixed-phase film is a film having a mixed phase of Cr, CrN, $Cr_2N$, and the like. The Cr mixed-phase film may contain unavoidable impurities such as chromium oxide.

The thickness of the resistors 30 may properly be chosen according to application without a particular restriction, and may be about 0.05 µm to 2 µm, for example. The thickness of the resistors 30 greater than or equal to 0.1 µm is particularly preferable from the viewpoint of improving the crystallinity of crystals in the resistors 30 (e.g., the crystallinity of α-Cr). The thickness of the resistors 30 less than or equal to 1 µm is more preferable from the viewpoint of reducing the warpage of the substrate 10 or reducing the cracking of the films caused by internal stress in the films constituting the resistors 30.

The width of the resistors 30 may properly be chosen according to application without a particular restriction, and may be about 0.1 µm to 1000 µm (i.e., 1 mm), for example. The pitch of the resistors 30 may properly be chosen according to application without a particular restriction, and may be about 1 mm to 100 mm, for example. FIG. 1 and FIG. 2 illustrate six resistors 31 and ten resistors 32. In practice, approximately a few hundreds to a few tens of thousands of resistors 31 and 32 are provided.

In the case in which the resistors 30 are a Cr phase-mixed film, α-Cr (alpha chromium), which is a stable crystalline phase, may be used as the main component to enable the stabilization of temperature coefficients of the resistors 30 and to enable the improvement of sensitivity of the resistors 30 with respect to applied pressure. Here, the term "main component" refers to the fact that the noted substance accounts for 50% or more by mass of the whole resistor material. However, from the viewpoint of achieving the stabilization of temperature coefficients of the resistors 30 and the improvement of sensitivity of the resistors 30 with respect to applied pressure, the resistors 30 preferably have an α-Cr content of 80% or more by weight. It may be noted that α-Cr is Cr in the bcc structure (i.e., body-centered cubic lattice structure).

The terminals 41 extend from both ends of the resistors 31 on the upper surface 10a of the substrate 10. The terminals 41 each have a generally rectangular shape with the width thereof wider than the resistors 31 in a plan view. The terminals 41, which serve as a pair of electrodes for outputting a change in the resistance value of the resistor 31 caused by applied pressure to the outside, are coupled to lead lines or a flexible substrate for external connection, for example. The upper surface of the terminals 41 may be coated with a metal having better solderability than the terminals 41. The resistors 31 and the terminals 41 are referred to by different reference symbols for the sake of convenience, but may be formed in the same process step, of the same material, and as a seamless piece.

The terminals 42 extend from both ends of the resistors 32 on the lower surface 10b of the substrate 10. The terminals 42 each have a generally rectangular shape with the width thereof wider than the resistors 32 in a plan view. The terminals 42, which serve as a pair of electrodes for outputting a change in the resistance value of the resistor 32 caused by applied pressure to the outside, are coupled to lead lines or a flexible substrate for external connection, for example. The upper surface of the terminals 42 may be coated with a metal having better solderability than the terminals 42. The resistors 32 and the terminals 42 are referred to by different reference symbols for the sake of convenience, but may be formed in the same process step, of the same material, and as a seamless structure.

A through-hole may be formed through the substrate 10, with all the terminals 41 and 42 being collected together on the upper surface 10a or on the lower surface 10b of the substrate 10.

A cover layer (i.e., an insulating resin layer) may be provided on the upper surface 10a of the substrate 10 such as to cover the resistors 31 while leaving the terminals 41 uncovered. Further, a cover layer (i.e., an insulating resin layer) may be provided on the lower surface 10b of the substrate 10 such as to cover the resistors 32 while leaving the terminals 42 uncovered. Provision of the cover layers serves to prevent mechanical damage or the like from occurring in the resistors 31 and 32. Further, provision of the cover layers serves to protect the resistors 31 and 32 from moisture or the like. The cover layers may be provided to cover the entire areas, except for the terminals 41 and 42.

The cover layers may be formed of an insulating resin such as a PI resin, an epoxy resin, a PEEK resin, a PEN resin, a PET resin, a PPS resin, a composite resin (e.g., silicone resin, polyolefin resin), for example. The cover layers may contain fillers and/or pigments. The thickness of the cover layers may properly be chosen according to application without a particular restriction, and may be about 2 µm to 30 µm, for example.

In order to manufacture the input device 1, the substrate 10 is first prepared, and the resistors 31 and the terminals 41 having plane shapes illustrated in FIG. 1 are formed on the upper surface 10a of the substrate 10. The material and thickness of the resistors 31 and the terminals 41 are the same as those previously described. The resistors 31 and the terminals 41 may be formed of the same material as a seamless structure.

The resistors 31 and the terminals 41 may be formed by the process in which a raw material capable of forming the resistors 31 and terminals 41 is used as a target in magnetron sputtering to deposit a film, which is then patterned by photolithography. The resistors 31 and the terminals 41 may be deposited by reactive sputtering, evaporation, arc ion plating, pulsed laser deposition, or the like in place of magnetron sputtering.

From the viewpoint of stabilizing the temperature coefficients of the resistors 31 and also improving the sensitivity of the resistors 31 with respect to applied pressure, a functional layer having a thickness of approximately 1 nm to 100 nm is preferably vacuum deposited as an underlayer prior to the deposition of the resistors 31 and the terminals 41. The functional layer may be deposited by conventional sputtering, for example. The functional layer is patterned by photolithography together with the resistors 31 and terminals 41 into the plane shape illustrated in FIG. 1 after the resistors 31 and terminals 41 are formed all over the upper surface of the functional layer.

In the present application, the term "functional layer" refers to a layer that has at least the function to facilitate crystal growth of resistors provided in an upper layer. The functional layer is preferably further provided with the function to prevent oxidation of the resistors caused by oxygen or moisture contained in the substrate 10 and also the function to improve adhesion between the substrate 10 and the resistors. The functional layers may additionally be provided with further functions.

The insulating resin film of the substrate 10 contains oxygen and moisture. When Cr, which forms a self-oxidized film, is contained in the resistors, thus, it is viable to provide the functional layer with the function to prevent oxidation of the resistors.

The material of the functional layer may properly be chosen according to application without a particular restriction, as long as the material at least has the function to facilitate crystal growth of the resistors in an upper layer. Examples of such a material include one or more metals selected from the group consisting of Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (iridium), Pt (platinum), Pd (palladium), Ag (silver), Au (gold), Co (cobalt), Mn (manganese), and Al (aluminum), an alloy of any of the metals in the group, or a compound of any of the metals in the group.

Examples of the above-noted alloy include FeCr, TiAl, FeNi, NiCr, CrCu, and the like. Examples of the above-noted compound include TiN, TaN, $Si_3N_4$, $TiO_2$, $Ta_2O_5$, $SiO_2$, and the like.

The functional layer may be vacuum deposited by conventional sputtering in which a raw material capable of forming the functional layer is used as a target, with Ar (argon) gas being introduced into the chamber. Use of conventional sputtering allows the functional layer to be formed while etching the upper surface 10a of the substrate 10 with Ar, thereby minimizing the amount of functional layer deposition and achieving the advantageous result of improved adhesion.

The noted method of depositing a functional layer is only an example, and other methods may be employed to deposit a functional layer. For example, the method may be such that plasma treatment or the like using Ar or the like may be performed to activate the upper surface 10a of the substrate 10 to bring about the advantageous result of improved adhesion prior to the deposition of a functional layer, followed by using magnetron sputtering to perform the vacuum deposition of a functional layer.

A combination of the material of the functional layer and the material of the resistors 31 and terminals 41 may properly be chosen according to application without a particular restriction. For example, Ti may be used for the functional layer, and a Cr mixed-phase film may be deposited as the resistors 31 and the terminals 41 by using α-Cr (alpha chromium) as the main component.

In this case, the resistors 31 and the terminals 41 may be deposited by magnetron sputtering in which a raw material capable of forming a Cr mixed-phase film is used as a target, with Ar gas being introduced into the chamber, for example. Alternatively, the resistors 31 and the terminals 41 may be deposited by reactive sputtering in which pure Cr is used as a target, with an Ar gas and a proper amount of nitrogen gas being introduced into the chamber.

In these methods, the growth surface of a Cr mixed-phase film is determined by the functional layer made of Ti, which enables the deposition of a Cr mixed-phase film having a stable crystal structure and having α-Cr as the main component. Further, Ti of the functional layer diffuses into the Cr mixed-phase film, which enables the stabilization of temperature coefficients of the resistors 31 and the improvement of sensitivity of the resistors 31 with respect to applied pressure. It may be noted that in the case of Ti being the material of the functional layer, Ti or TiN (titanium nitride) may be contained in the Cr mixed-phase film.

In the case of the resistors 31 being a Cr mixed-phase film, the functional layer made of Ti has all the functions including the function to facilitate crystal growth of the resistors 31, the function to prevent oxidation of the resistors 31 caused by oxygen or moisture contained in the substrate 10, and the function to improve adhesion between the substrate 10 and the resistors 31. The same applies when Ta, Si, Al, or Fe is used in place of Ti as the functional layer.

As described above, provision of a functional layer under the resistors 31 enables the facilitation of crystal growth of the resistors 31, thereby allowing the manufacture of the resistors 31 having a stable crystal phase. In the input device 1, thus, the temperature coefficients of the resistors 31 are stabilized, and the sensitivity of the resistors 31 with respect to applied pressure is improved. Further, the diffusion of a functional layer material into a Cr mixed-phase film in the input device 1 enables the stabilization of temperature coefficients of the resistors 31 and the improvement of sensitivity of the resistors 31 with respect to applied pressure.

Subsequently, the resistors 32 and the terminals 42 having plane shapes illustrated in FIG. 1 are formed on the lower surface 10b of the substrate 10. The resistors 32 and terminals 42 may be formed in substantially the same manner as the resistors 31 and terminals 41. The fact that a functional layer is preferably deposited on the lower surface 10b of the substrate 10 as an underlayer before depositing the resistors 32 and terminals 42 is also the same.

After the resistors 31 and terminals 41 as well as the resistors 32 and terminals 42 are formed, cover layers may be formed according to need, i.e., a cover layer to cover the resistors 31 and to leave the terminals 41 uncovered on the upper surface 10a of the substrate 10 and a cover layer to cover the resistors 32 and to leave the terminals 42 uncovered on the lower surface 10b of the substrate 10. With this, the input device 1 is completed in final form.

A cover layer may be made by laminating a thermosetting insulating resin film in the semi-cured state on the upper surface 10a of the substrate 10 such as to cover the resistors 31 and to leave the terminals 41 uncovered, followed by heating and curing. Further, a cover layer may be made by laminating a thermosetting insulating resin film in the semi-cured state on the lower surface 10b of the substrate 10 such as to cover the resistors 32 and to leave the terminals 42 uncovered, followed by heating and curing. Instead of laminating an insulating resin film, a cover layer may be made by applying a thermosetting insulating resin in a liquid or paste form, followed by heating and curing.

Figure 3:
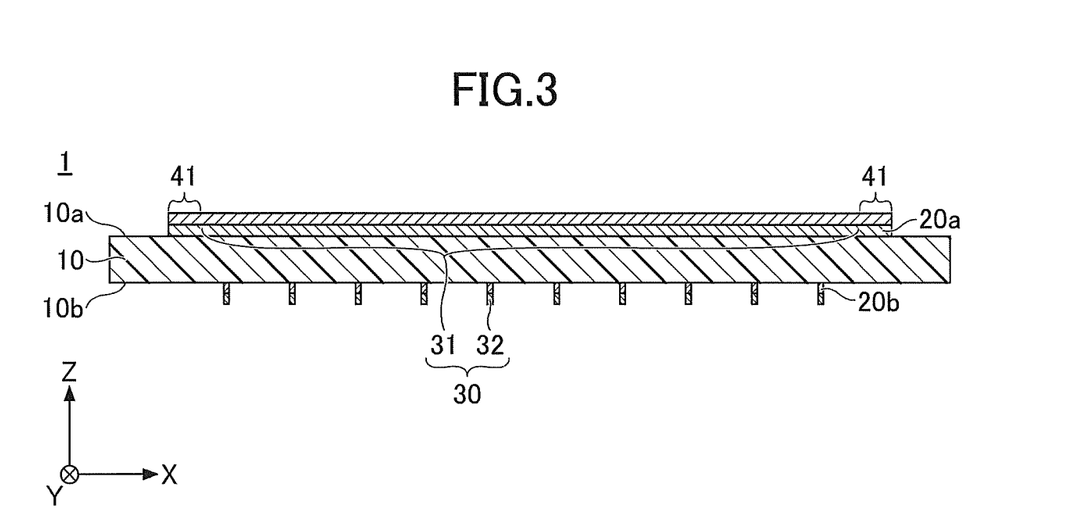
FIG. 3 a cross-sectional view (part 2) illustrating an example of the input device according to the first embodiment.

When a functional layer is provided on the upper surface 10a of the substrate 10 as an underlayer for the resistors 31 and the terminals 41 and a functional layer is provided on the lower surface 10b of the substrate 10 as an underlayer for the resistors 32 and the terminals 42, the input device 1 has a cross-sectional shape as illustrated in FIG. 3. The layers designated by reference symbols 20a and 20b are functional layers. The plane shape of the input device 1 provided with the functional layers 20a and 20b is the same as illustrated in FIG. 1.

Figure 4:
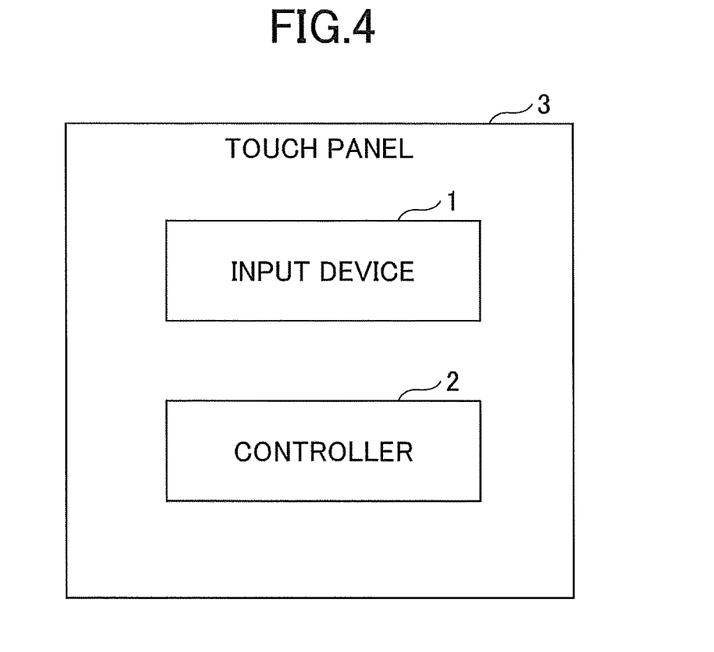
FIG. 4 is a block diagram illustrating an example of the touch panel according to the first embodiment.

As illustrated in FIG. 4, the touch panel 3 may be implemented as the input device 1 and a controller 2. The touch panel 3, which is a panel operable to be contacted by a pen or a finger to enter input, is mounted on the front surface or back surface of a display device to be widely used in various electronic devices and portable terminals such as personal computers and smartphones. Examples of a display device on which the touch panel 3 is mounted include, but are not limited to, a liquid crystal display device and an organic EL (electro-luminescence) display device.

The input device 1 has a horizontally symmetric structure. It thus does not matter whether the input device 1 is mounted on the display device such that the side on which the resistors 31 are disposed face toward the display device, or is mounted on the display device such that the side on which the resistors 32 are disposed face toward the display device.

In the touch panel 3, the terminals 41 and 42 of the input device 1 are connected to the controller 2 through a flexible substrate, lead wires, or the like, for example.

Based on information supplied from the terminals 41 and 42 of the input device 1, the controller 2 may detect the coordinates of a point at which the input device 1 is pressed and the magnitude of applied pressure. The resistors 31 of the input device 1 may be used for detecting the X coordinate and the resistors 32 may be used for detecting the Y coordinate, for example.

Figure 5:
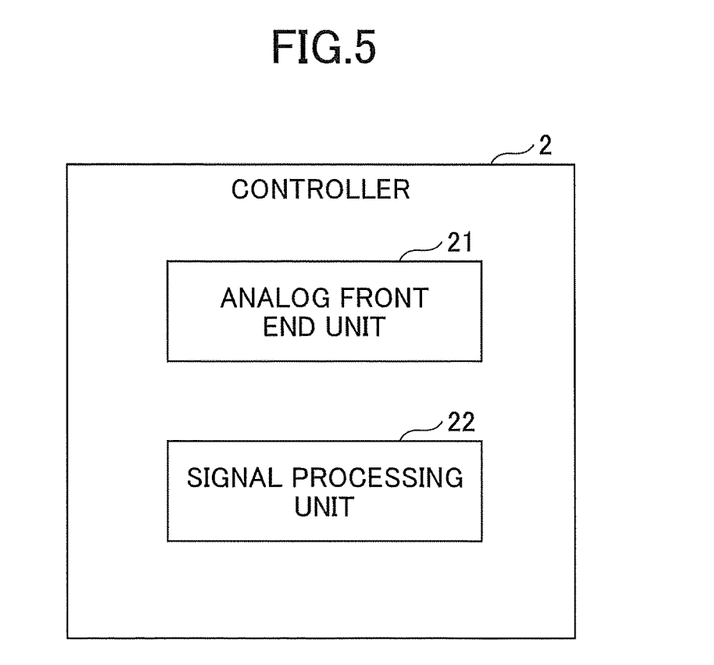
FIG. 5 is a block diagram illustrating an example of a controller for the touch panel according to the first embodiment.

As illustrated in FIG. 5, the controller 2 may be configured to include an analog front end unit 21 and a signal processing unit 22, for example.

The analog front end unit 21 includes an input-signal selecting switch, a bridge circuit, an amplifier, an analog-to-digital converter circuit (i.e., A/D converter circuit), and the like, for example. The analog front end unit 21 may include a temperature compensating circuit.

The analog front end unit 21 may be such that all the terminals 41 and 42 of the input device 1 are connected to the input-signal selecting switch, which then selects a pair of electrodes, for example. The pair of electrodes selected by the input-signal selecting switch is coupled to the bridge circuit.

Specifically, the resistor between the two electrodes selected by the input-signal selecting switch serves as one side of the bridge circuit while the other three sides are fixed resistors. With this arrangement, the output of the bridge circuit provides a voltage (i.e., analog signal) corresponding to the resistance value of the resistor connected between the two electrodes selected by the input-signal selecting switch. It may be noted that the input-signal selecting switch is configured to be controllable by the signal processing unit 22.

The voltage output from the bridge circuit is amplified by the amplifier, and is then converted into a digital signal by the A/D converter circuit for provision to the signal processing unit 22. In the case in which the analog front end unit 21 includes a temperature compensation circuit, a temperature compensated digital signal is sent to the signal processing unit 22. Switching the input-signal selecting switch at high speed allows the digital signals corresponding to the resistance values associated with all the terminals 41 and 42 of the input device 1 to be transmitted to the signal processing unit 22 in a very short time.

Based on the information supplied from the analog front end unit 21, the signal processing unit 22 may detect the coordinates of a point at which the input device 1 is pressed and the magnitude of applied pressure. For example, the resistance value of the resistor 31 located at the bottom in FIG. 1 and the resistance value of the second resistor 32 from the left may be changed. In such a case, the event that the point B illustrated in FIG. 1 is pressed may be detected. Further, the magnitude of pressure applied at the point B in FIG. 1 may be detected based on the magnitude of a change in the resistance value of the resistor 31 located at the bottom and the magnitude of a change in the resistance value of the second resistor 32 from the left.

The resistance values of a plurality of resistors 31 and the resistance values of a plurality of resistors 32 may be changed. In such a case, the event that a plurality of points are pressed on the input device 1 may be detected.

When applied pressure is small, there may be a case in which, among the resistors 31 and the resistors 32, only the resistors closer to the pressed side are squeezed while the resistors farther away from the pressed side are not squeezed. In such a case, a resistance value varies continuously in accordance with the magnitude of applied pressure only with respect to a pair of electrodes associated with a resistor closer to the pressed side. Despite this, the signal processing unit 22 may be able to detect the magnitude of applied pressure based on the magnitude of a change in the resistance value of a resistor closer to the pressed side.

When a resistor 31 and/or a resistor 32 are squeezed, the resistance value between the two electrodes associated with a squeezed resistor (i.e., the resistor 31 and/or the resistor 32) changes continuously in accordance with the magnitude of applied pressure. Regardless of whether either the resistor 31 or the resistor 32 or both are squeezed, the signal processing unit 22 is able to detect the magnitude of applied pressure based on the magnitude of a change in the resistance value of a squeezed resistor.

The signal processing unit 22 may be configured to include a CPU (central processing unit), a ROM (read only memory), a RAM (random access memory), a main memory, and the like, for example.

In this case, various functions of the signal processing unit 22 may be provided by the CPU executing programs that are loaded from the ROM or the like to the main memory. Alternatively, part or all of the signal processing unit 22 may be implemented solely as hardware. The signal processing unit 22 may be composed of a plurality of devices physically separate from each other.

In the manner described above, when the resistors 31 and 32 of the input device 1 are pressed, the pressed resistors 31 and 32 are bent in response to the applied pressure, so that the resistance value between the two electrodes associated with any one of the pressed resistors 31 and 32 varies continuously in accordance with the magnitude of applied pressure. Namely, the input device 1 enables the provision of three-dimensional information (i.e., the coordinates of a pressed point and the magnitude of applied pressure).

In the touch panel 3, the three-dimensional information obtained by the input device 1 is supplied to the controller 2. Based on this three-dimensional information supplied from the input device 1, the controller 2 serves to detect the magnitude of applied pressure in addition to the coordinates of a point at which the input device 1 is pressed.

Especially when the resistors 31 and 32 are made of a Cr mixed-phase film, resistance sensitivity (i.e., the magnitude of a change in the resistance values of the resistors 31 and 32 in response to a constant magnitude of applied pressure) is significantly improved compared to when the resistors 31 and 32 are made of Cu—Ni or Ni—Cr. When the resistors 31 and 32 are made of a Cr mixed-phase film, resistance sensitivity with respect to applied pressure is approximately 5 to 10 times greater than when the resistors 31 and 32 are made of Cu—Ni or Ni—Cr. Use of the resistors 31 and 32 made of a Cr mixed-phase film enables the improvement of detection accuracy with respect to the coordinates of a pressed point, and also enables the high-sensitivity detection of applied pressure.

In addition, use of high resistance sensitivity with respect to applied pressure makes it possible to realize control operations such as to perform a predetermined operation upon detecting the application of pressure of small magnitude, to perform another operation upon detecting the application of pressure of medium magnitude, and to perform yet another operation upon detecting the application of pressure of large magnitude. Alternatively, control operations may be realized such that no operations are performed upon detecting the application of pressure of small or medium magnitude, and a predetermined operation is performed only upon detecting the application of pressure of large magnitude. This enables the prevention of erroneous operations caused by mistaken touch.

Moreover, use of high resistance sensitivity with respect to applied pressure allows obtained signals to have a high S/N ratio. Accurate signal detection is thus achievable even when the number of averaging operations performed by the A/D converter circuit is reduced in the analog front end unit 21. Reducing the number of averaging operations performed in the A/D converter circuit serves to shorten the time required for one A/D conversion, thereby making it possible to increase the speed at which the input-signal selecting switch is switched. As a result, the input device 1 is able to detect swift touch operations performed thereon.

In addition, use of high resistance sensitivity with respect to applied pressure makes it possible to detect whether pressure is applied and also to detect the magnitude of applied pressure even when the touch panel 3 is mounted on the back side of the display device so as to receive applied pressure via the display device. With the touch panel 3 mounted on the back face of the display device, the touch panel 3 can be operated without reducing the visibility of the display device.

It may be noted that the width of the resistors 31 and 32 may be decreased (e.g., to 10 μm or less) to reduce the deterioration of visibility of the display device. This allows the touch panel 3 to be mounted on the front face of the display device.

First Variation of First Embodiment

The first variation of the first embodiment is directed to an example of an input device that has an electronic component mounted on the first surface or second surface of the substrate. In connection with the first variation of the first embodiment, a description of the same constituent elements as those of the previously described embodiments may be omitted as appropriate.

Figure 6:
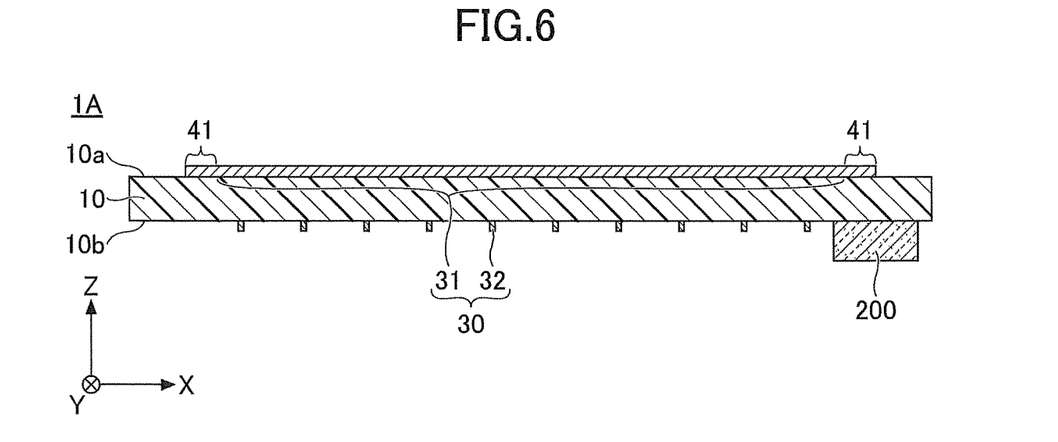
FIG. 6 is a cross-sectional view illustrating an example of the input device according to a first variation of the first embodiment.

FIG. 6 is a cross-sectional view illustrating an example of the input device according to a first variation of the first embodiment, and shows a cross-section corresponding to FIG. 2. Referring to FIG. 6, an input device 1A differs from the input device 1 (see FIG. 1 and FIG. 2) in that an electronic component 200 is mounted on the lower surface 10b of the substrate 10.

The electronic component 200 may be an IC in which the analog front end unit 21 illustrated in FIG. 5 is implemented and which is provided with an external communication function (e.g., a serial communication function such as $I^2C$), for example. Namely, the electronic component 200 is an IC that contains an input-signal selecting switch, a bridge circuit, an amplifier, an A/D converter circuit, an external communication function, and the like, and is able to convert resistance values between the opposite electrodes of the resistors 31 and 32 into voltages for output as digital signals. The electronic component 200 may include a temperature compensating circuit. The electronic component 200 uses the external communication function to transmit and receive information to and from the signal processing unit 22 of the controller 2.

The electronic component 200 may be flip-chip mounted on pads formed on the lower surface 10b of the substrate 10, for example. Alternatively, the electronic component 200 may be mounted on the lower surface 10b of the substrate 10 via an adhesive layer such as a die attach film, and may be wire-bonded to pads formed on the lower surface 10b of the substrate 10. Passive components such as capacitors may also be mounted in addition to the electronic components 200.

The electronic component 200 is connected to all the terminals 41 and 42 through interconnect patterns and through-interconnects (i.e., through-holes) which are not shown. The electronic component 200 is configured to be capable of receiving power from outside the input device 1A.

A cover layer (i.e., an insulating resin layer) may be provided on the upper surface 10a of the substrate 10 such as to cover the resistors 31 and the terminals 41. Further, a cover layer (i.e., an insulating resin layer) may be provided on the lower surface 10b of the substrate 10 such as to cover the resistors 32, the terminals 42, and the electronic component 200. Provision of the cover layers serves to prevent mechanical damage or the like from occurring in the resistors 31 and 32, the terminals 41 and 42, and the electronic component 200. Further, provision of the cover layers serves to protect the resistors 31 and 32, the terminals 41 and 42, and the electronic component 200 from moisture or the like.

Since the input device 1A has the electronic component 200 mounted on the substrate 10, the terminals 41 and 42 can be connected to the electronic component 200 at short distances through interconnect patterns and through-interconnects (i.e., through-holes). With this arrangement, a small-sized input device 1A is realized. This structure is particularly useful for small-sized input devices for which resistors and an electronic component are difficult to connect to each other through lead lines and solder or the like.

In addition, shortening the distance from the terminals 41 and 42 to the electronic component 200 enables the improvement of noise tolerance.

It may be noted that although FIG. 6 illustrates an example in which the electronic component 200 is mounted on the lower surface 10b of the substrate 10, the electronic component 200 may alternatively be mounted on the upper surface 10a of the substrate 10. The electronic component 200 is not limited to an IC having the function of the analog front end unit 21, and may be an IC having the functions of both the analog front end unit 21 and the signal processing unit 22.

Namely, part or all of the controller 2 may be integrated with the input device 1A. Here, the phrase "integrated with the input device 1A" encompasses the case in which all or part of a substrate and an electronic component used for the controller 2 and all or part of a substrate and an electronic component used for the input device 1A are subject to shared use.

Second Variation of First Embodiment

The second variation of the first embodiment is directed to an example of an input device that has a solar cell mounted on the first surface or second surface of the substrate. In connection with the second variation of the first embodiment, a description of the same constituent elements as those of the previously described embodiments may be omitted as appropriate.

Figure 7:
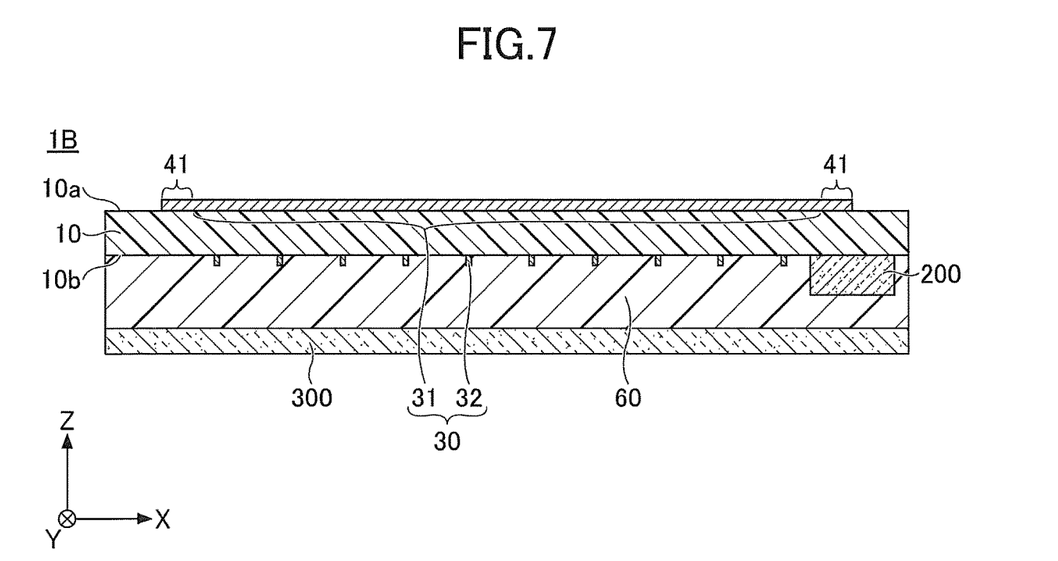
FIG. 7 is a cross-sectional view illustrating an example of the input device according to a second variation of the first embodiment.

FIG. 7 is a cross-sectional view illustrating an example of the input device according to the second variation of the first embodiment, and shows a cross-section corresponding to FIG. 2. Referring to FIG. 7, an input device 1B differs from the input device 1A (see FIG. 6) in that a solar cell 300 is mounted.

The solar cell 300 is mounted on the lower surface 10b of the substrate 10. Specifically, a cover layer 60 is provided on the lower surface 10b of the substrate 10 to cover the resistors 32, the terminals 42, and the electronic component 200, and the solar cell 300 is disposed on the lower surface of the cover layer 60. The solar cell 300 is connected to the electronic component 200 through interconnect patterns and through-interconnects (through-holes) which are not shown, and serves to supply electrical power to the electronic component 200.

The solar cell 300 is an amorphous-silicon-based, silicon-crystal-based, or compound-based (e.g., CIGS) flexible solar cell which is laminated on the cover layer 60, for example. The term "CIGS" refers to a compound-based solar cell composed mainly of copper (Cu), indium (In), gallium (Ga), and selenium (Se).

As described above, the input device 1B is provided with the solar cell 300 serving as a power supply for supplying power to the electronic component 200. This arrangement enables the realization of a small-sized input device 1B which is free from the need for an external power supply.

Use of the thin-film resistors 30 in the input device 1B specifically allows the input device 1B to have reduced size and reduced power consumption.

Specifically, while the resistance value of the resistors 30 is approximately 1 kΩ in the case of a Cu—Ni or Ni—Cr foil, for example, being used as the material for the resistors 30, use of a thin Cr mixed-phase film as the material for the resistors 30 allows the resistance value of the resistors 30 to be greater than or equal to 5 kΩ. The use of a Cr mixed-phase film as the material for the resistors 30 thus causes reduction in the amount of current flowing through the resistors 30, thereby enabling the reduction of power consumption. Further, since it suffices for the current supplied from the solar cell 300 to be of small amount due to the reduction in power consumption, the use of a small-sized solar cell 300 is acceptable, thereby allowing the entire input device 1B to have reduced size.

It may be noted that although FIG. 7 illustrates an example in which the solar cell 300 is mounted on the lower surface 10b of the substrate 10, the solar cell 300 may alternatively be mounted on the upper surface 10a of the substrate 10.

Alternatively, the solar cell 300 may be mounted directly, without an intervening cover layer, on the upper surface 10a of the substrate 10 in areas where no resistors 31 are disposed, or on the lower surface 10b of the substrate 10 in areas where no resistors 32 are disposed.

Further, instead of using the method of laminating a flexible solar cell, the solar cell 300 may be formed by sequentially laminating a first electrode layer, a power generation layer, a second electrode layer, and the like on the cover layer or the like by evaporation or sputtering, for example.

Moreover, a small-sized battery (e.g., a lithium ion battery or the like) may be used as the power supply in place of the solar cell 300.

Third Variation of First Embodiment

A third variation of the first embodiment is directed to a configuration in which the resistors of the input device are made in a zigzag pattern. In connection with the third variation of the first embodiment, a description of the same constituent elements as those of the previously described embodiments may be omitted as appropriate.

Figure 8:
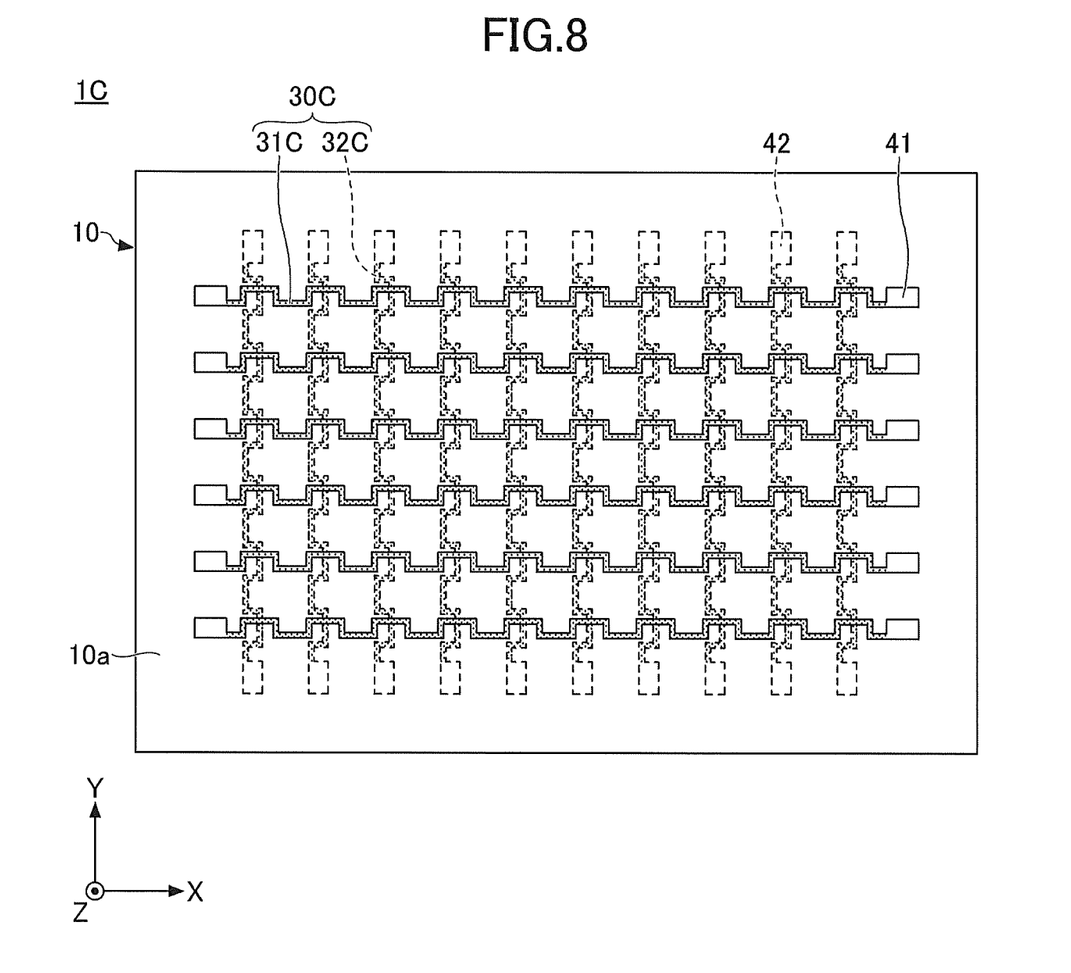
FIG. 8 is a plan view illustrating an example of the input device according to a third variation of the first embodiment.

FIG. 8 is a plan view illustrating an example of the input device according to the third variation of the first embodiment, and shows a plane corresponding to FIG. 1. Referring to FIG. 8, an input device 1C differs from the input device 1 (see FIG. 1 and FIG. 2) in that the resistors 30 are replaced with resistors 30C.

The resistors 30C include resistors 31C and 32C. The resistors 31C are each a zigzag pattern formed between two of the terminals 41. Also, the resistors 32C are each a zigzag pattern formed between two of the terminals 42. The material and thickness of the resistors 31C and 32C may be substantially the same as the material and thickness of the resistors 31 and 32, for example.

Use of zigzag patterns as the resistors 31C and 32C allows a resistance value between two of the terminals 41 and a resistance value between two of the terminals 42 to be higher compared with the case in which straight line patterns are employed. As a result, a change in the resistance value between two of the terminals 41 and a change in the resistance value between two of the terminals 42 upon being pressed are increased, which enables the further improvement of detection accuracy with respect to the coordinates of a pressed point, and also enables the further heightened sensitivity detection of applied pressure.

Moreover, increases in the resistance value between two of the terminals 41 and in the resistance value between two of the terminals 42 allow the input device 10 to have reduced power consumption.

Although a description has been given with respect to preferred embodiments and the like, the present invention is not limited to these embodiments and the like, but various variations and modifications may be made to these embodiments and the like without departing from the scope of the present invention.

For example, the input device 1 has been described with respect to an example in which the resistors 31 are provided on the upper surface 10a of the substrate 10 serving as an insulating layer, and the resistors 32 are provided on the lower surface 10b. This is not a limiting example, and the configuration suffices as long as the resistors 32 are provided on one side of an insulating layer, and the resistors 32 are provided on the other side of the insulating layer. As an example, the resistors 31 may be provided on the upper surface 10a of the substrate 10, and an insulating layer covering the resistors 31 may be provided on the upper surface 10a of the substrate 10, with the resistors 32 being provided on the insulating layer. Alternatively, a first substrate having the resistors 31 provided thereon and a second substrate having the resistors 32 provided thereon are made. The first substrate with the resistors 31 and the second substrate with the resistors 32 may then be attached to each other with an intervening insulating layer therebetween such that the resistors 31 and the resistors 32 face toward the inside. Alternatively, a first substrate having the resistors 31 provided thereon and a second substrate having the resistors 32 provided thereon are made, followed by stacking the first substrate with the resistors 31 and the second substrate with the resistors 32 one over another in the same direction. The same applies in the case of input devices 1A, 1B and 1C.

This international application claims foreign priority to Japanese Patent Application No. 2018-137172 filed on Jul. 20, 2018, and the entire contents of Japanese Patent Application No. 2018-137172 are incorporated in the international application by reference.

DESCRIPTION OF REFERENCE SYMBOLS 1, 1A, 1B, 1C input device, 2 controller, 3 touch panel, 10 substrate, 10a substrate upper surface, 10b substrate lower surface, 20a, 20b functional layer, 21 analog front end unit, 22 signal processing unit, 30, 30C resistors, 31, 31C, 32, 32C resistors, 41, 42 terminals, 60 cover layer, 200 electronic component, 300 solar cell

The invention claimed is:

1. An input device, comprising:
an insulating layer;
a plurality of first resistors arrayed on one side of the insulating layer with a longitudinal direction thereof extending in a first direction;
a plurality of second resistors arrayed on an opposite side of the insulating layer with a longitudinal direction thereof extending in a second direction intersecting the first direction; and
a pair of electrodes provided at opposite ends of a corresponding one of the first resistors and the second resistors,
wherein the first resistors and the second resistors are formed of a Cr mixed-phase film that contains alpha chromium as a main component,
wherein upon the first resistors and/or the second resistors being pressed, a resistance value between the pair of electrodes associated with pressed one or more of the first resistors and/or the second resistors changes continuously in accordance with a magnitude of applied pressure.

2. The input device as claimed in claim 1, wherein the first resistors and the second resistors are each a zigzag pattern formed between the pair of electrodes.

3. The input device as claimed in claim 1, wherein a position in the first direction and in the second direction is detectable based on a change in a resistance value in the first resistors and a change in a resistance value in the second resistors.

4. The input device as claimed in claim 1, wherein the first resistors and the second resistors have an alpha chromium content of 80% or more by weight.

5. The input device as claimed in claim 1, wherein the first resistors and the second resistors contain chromium nitride.

6. The input device as claimed in claim 1, further comprising a functional layer made of a metal, an alloy, or a metal compound as an underlayer of the first resistors and as an underlayer of the second resistors.

7. The input device as claimed in claim 6, wherein the functional layer has a function to facilitate crystal growth of the first resistors and the second resistors.

8. The input device as claimed in claim 1, further comprising an electronic component mounted on one surface or another surface of the insulating layer.

9. The input device as claimed in claim 8, wherein the electronic component converts a resistance value between the pair of electrodes associated with the first resistors and the second resistors into a voltage for output as a digital signal.

10. The input device as claimed in claim 8, further comprising a power supply mounted on the one surface or another surface of the insulating layer and electrically connected to the electronic component to supply power to the electronic component.

* * * * *